United States Patent [19]

Leupold

[11] Patent Number: 4,928,081

[45] Date of Patent: May 22, 1990

[54] METHOD OF MASS PRODUCING SUPERCONDUCTING PERSISTENT CURRENT RINGS

[75] Inventor: Herbert A. Leupold, Eatontown, N.J.

[73] Assignee: The United States of America as represented by the Secretary of the Army, Washington, D.C.

[21] Appl. No.: 322,381

[22] Filed: Mar. 13, 1989

[51] Int. Cl.$^5$ .............................................. H01F 7/22
[52] U.S. Cl. ..................................... 335/216; 335/284
[58] Field of Search ............................... 335/216, 284; 336/DIG. 1

[56] References Cited

U.S. PATENT DOCUMENTS

| | | | |
|---|---|---|---|
| 3,158,792 | 11/1964 | Swartz et al. | 335/216 |
| 3,158,794 | 11/1964 | Swartz | 335/216 |
| 3,609,611 | 9/1971 | Parnell | 335/284 |
| 3,624,572 | 11/1971 | Mallinson | 335/284 X |

FOREIGN PATENT DOCUMENTS 0104208  6/1982  Japan .................................... 335/284

*Primary Examiner*—George Harris
*Attorney, Agent, or Firm*—Michael J. Zelenka; Roy E. Gordon

[57] ABSTRACT

Superconducting persistent current rings are mass produced by passing each superconducting ring through a tapered magnetic field that is tapered in strength so that when each ring passes through the maximum magnetic field of the tapered magnetic field which is above the critical field of the tapered magnetic field the superconducting ring becomes normal thereby admitting all of the flux to which its cross section is exposed. When the ring is passed to a region of field lower in strength than the critical field, the ring becomes superconducting again and traps the flux to which its cross section is exposed.

6 Claims, 1 Drawing Sheet

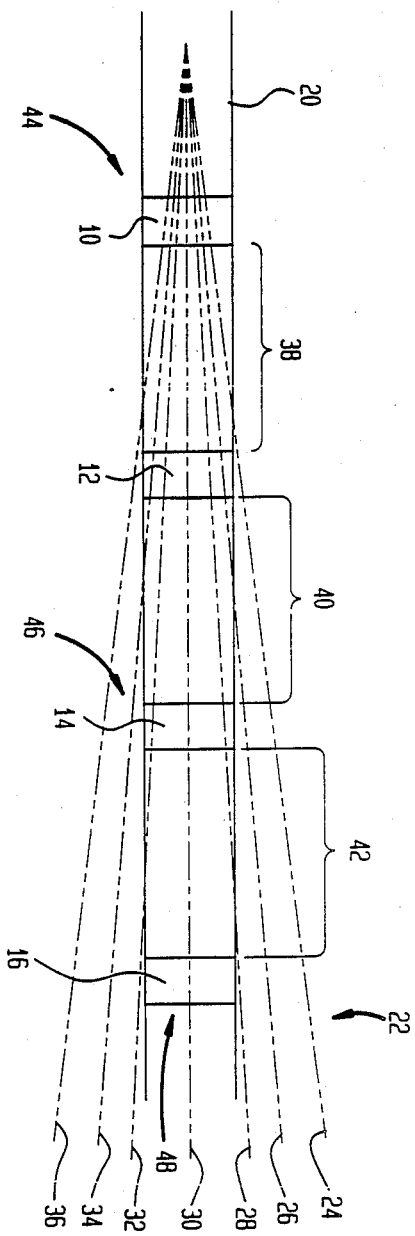

METHOD OF MASS PRODUCING SUPERCONDUCTING PERSISTENT CURRENT RINGS

The invention described herein may be manufactured, used and licensed by or for the Government for governmental purposes without the payment to me of any royalty thereon.

The invention relates in general to a method of mass producing superconducting rings and in particular to a method of mass producing superconducting persistent current rings or superconducting rings with a persistent current flowing around the periphery of each ring.

BACKGROUND OF THE INVENTION

Heretofore, it has been known to provide an individual or single superconducting ring with a persistent current flowing around the periphery of the ring and with accompanying magnetic flux trapped within the interior cavity of the ring. This has generally been accomplished by placing the superconducting ring in an applied magnetic field at a temperature above its transition temperature and then cooling below its transition temperature and then removing the applied magnetic field. Such a method does not readily lend itself to mass production.

SUMMARY OF THE INVENTION

The general object of this invention is to provide a method of mass producing superconducting persistent current rings or superconducting rings with a persistent current flowing around the periphery of each ring and with accompanying magnetic flux trapped within the interior cavity of each ring. A more particular object of the invention is to provide such a method without the need of electrical power.

It has now been found that the aforementioned objects can be attained by passing superconducting rings with no persistent current flowing around each ring through the maximum magnetic field of a tapered magnetic field wherein the tapered magnetic field is tapered in strength from a maximum magnetic field to a minimum magnetic field so that each ring passing through the maximum magnetic field which is above the critical magnetic field becomes normal thereby admitting and passing through all of the magnetic flux to which its cross section is exposed and then passing each ring to a region of the tapered magnetic field lower in strength than the critical magnetic field so that each ring becomes superconducting again and traps the magnetic flux to which its cross section is exposed.

In the above described method, each superconducting ring might be made from niobium or tantalum and passed through the tapered magnetic field at about 4.2° K. The rings can conveniently be passed along a conveyor or bar with the tapered magnetic field being coaxial with respect to each ring. Sufficient spacing must be allowed to preclude interference between successive rings.

In the afore described method, normal means non-superconducting. Maximum field is referring to the largest magnetic field to which each ring is exposed. By the term critical field is meant the minimum magnetic field that is required to be applied to a superconducting ring to make the ring normal. In this connection, if a superconductor is subjected to a magnetic field, it will not be superconductive if the field is greater than a critical value characteristic of the ring material. It will be superconductive if the field is less than that critical value.

Once the ring has passed to a region of the tapered magnetic field lower than critical, the ring becomes superconducting again and traps the magnetic flux threading it. Since the field is tapered, the ring never again encounters magnetic fields above critical in its passage through the tapered field and the magnetic flux remains trapped within the interior cavity of the ring. The tapered magnetic field source can be a supeconducting gradient field or a more conventional electromagnetic or permanent magnet field source. The particular source of the tapered magnetic field used is not part of the invention.

DESCRIPTION OF THE DRAWING

The drawing shows a series of superconducting rings 10, 12, 14, 16 being passed by means of a conveyor bar, 20, through a tapered magnetic field 22, indicated by magnetic field lines 24, 26, 28, and 30, 32, 34, 36. Sufficient spacing 38, 40, 42 is provided to preclude interference between successive rings. When each ring passes through the maximum magnetic field, 44, the most field lines will pass through the ring and the ring becomes normal. When the ring then passes through the critical magnetic field, 46, to a region of lower strength, 48, indicated by a lesser number of field lines passing through the ring each ring becomes superconducting again and traps flux according to the equation $\phi = H_C A_R$ where $H_C$ is the critical field and $A_R$ is the cross sectional area of the ring.

I wish it to be understood that I do not desire to be limited to the exact details of construction as described for obvious modifications will occur to a person skilled in the art.

What is claimed is:

1. Method of mass producing superconducting rings with a persistent current flowing around the periphery of each ring and with accompanying magnetic flux trapped within the interior cavity of each ring from superconducting rings with no persistent current flowing around each ring and with no magnetic flux trapped within the interior cavity of each ring, said method comprising passing the superconducting rings with no persistent current flowing around each ring through the maximum magnetic field of a tapered magnetic field wherein the tapered magnetic field is tapered in strength so that each ring passing through the maximum magnetic field which is above the critical magnetic field becomes normal thereby passing through all of the magnetic flux to which its cross section is exposed and then passing each ring to a region of the tapered magnetic field lower in strength than the critical magnetic field whereby each ring becomes superconducting again and traps the magnetic flux to which its cross section is exposed.

2. Method according to claim 2 wherein the superconducting ring is a tantalum ring.

3. Method according to claim 1 wherein the superconducting ring is a niobium ring.

4. Method according to claim 1 wherein the tapered magnetic field is coaxial with respect to each superconducting ring passing through it.

5. Method according to claim 1 wherein the superconducting rings are passed through the tapered magnetic field along a bar.

6. Method according to claim 1 wherein each ring is passed through the tapered magnetic field with sufficient spacing between rings to preclude interference between successive rings.

* * * * *